United States Patent [19]

Chakravorty et al.

[11] Patent Number: 5,081,005
[45] Date of Patent: Jan. 14, 1992

[54] METHOD FOR REDUCING CHEMICAL INTERACTION BETWEEN COPPER FEATURES AND PHOTOSENSITIVE DIELECTRIC COMPOSITIONS

[75] Inventors: Kishore K. Chakravorty, Issaquah; Jay M. Cech, Bellevue, both of Wash.

[73] Assignee: The Boeing Company, Seattle, Wash.

[21] Appl. No.: 328,524

[22] Filed: Mar. 24, 1989

[51] Int. Cl.$^5$ .......................... G03F 7/09; G03F 7/26; G03F 7/038
[52] U.S. Cl. .................................. 430/325; 430/272; 430/277; 430/954; 430/961; 430/311
[58] Field of Search ............... 430/272, 277, 954, 961, 430/325, 311

[56] References Cited

U.S. PATENT DOCUMENTS

| | | | |
|---|---|---|---|
| 3,508,983 | 4/1970 | Origer et al. | 428/901 X |
| 3,520,683 | 7/1970 | Kerwin | 430/272 X |
| 3,615,538 | 10/1971 | Peters et al. | 430/196 X |
| 4,732,858 | 3/1988 | Brewer et al. | 430/272 X |
| 4,786,569 | 11/1988 | Rohde et al. | 430/272 X |

FOREIGN PATENT DOCUMENTS

| | | | |
|---|---|---|---|
| 0151149 | 8/1984 | Japan | 430/272 |
| 0125631 | 9/1980 | D.P.R. of Korea | 430/272 |

Primary Examiner—Cynthia Hamilton
Attorney, Agent, or Firm—Christensen, O'Connor Johnson & Kindness

[57] ABSTRACT

The surface of metallic features are coated with a desensitizer composition comprising an amino-silane to reduce the likelihood of chemical interaction between the metallic feature and a photosensitive functional group that is included in a dielectric composition that is coated over the metallic features. The chemical interaction adversely affects the photosensitivity of the dielectric composition and, thus, inhibits the formation of complete and well defined via interconnections through the dielectric composition.

7 Claims, 2 Drawing Sheets

METHOD FOR REDUCING CHEMICAL INTERACTION BETWEEN COPPER FEATURES AND PHOTOSENSITIVE DIELECTRIC COMPOSITIONS

TECHNICAL FIELD

The present invention relates to photolithographic patterning of photosensitive dielectric compositions, particularly those photosensitive polyimide precursor compositions containing a light sensitive functional group that renders the dielectric composition photosensitive.

BACKGROUND OF THE INVENTION

Continual advancements in the speed and integration level of integrated circuits used in high performance systems have created a demand for the development of an interconnect technology that offers a high wiring density, good electrical characteristics for the propagation of high-speed signals, and good thermal performance. Multi-layer interconnection schemes with fine line conductors and associated ground planes have been proposed for applications in high performance systems. Fine geometry copper conductor lines defined in a photolithographically patterned layer of a low dielectric constant polymer, such as a polyimide, have emerged as a versatile packaging approach for the interconnection lines between densely packed integrated circuit chips in high performance systems.

In general, an initial X-plane of metallic features, such as fine geometry conductor lines, can be produced by the following steps: (1) depositing a film of a metallic seed layer on a dielectric substrate, (2) etching the seed layer to form fine geometry lines that serve as the electroplating base for the conductor lines, (3) spin coating a layer of a photosensitive dielectric composition over the dielectric substrate and etched seed layer, (4) photolithographically patterning the layer of the dielectric composition to form fine geometry dielectric features, the seed layer being uncovered between these dielectric features, and (5) forming the metallic features by electroplating a conductive material, such as copper, onto the seed layer between the patterned dielectric features.

In order to increase the density of the number of fine geometry conductor lines, an additional secondary Y-plane of conductor lines passing in a direction orthogonal to the lines of the initial X-plane can be formed on top of the initial X-plane. Electrical connections between the lines of the two planes are provided by via interconnects between the two planes. The via interconnects are holes that pass through a layer of the dielectric composition that is coated over the initial X-plane and serves as the base for the secondary Y-plane of orthogonal conductor lines. When certain conductor lines (e.g., copper lines) in the initial X-plane are coated with a dielectric composition that includes a polyimide precursor having a photosensitive functional group that renders the dielectric composition photosensitive, a chemical interaction between the photosensitive functional group of the polyimide precursor and the composition making up the upper surface of the conductor lines changes the photosensitivity of the dielectric composition in a manner that adversely affects the results of the photolithographic patterning step. Dielectric features, especially the via interconnects, that are photolithographically patterned into the altered layer of the dielectric composition are incomplete and less than well defined. The incomplete and less than well defined dielectric features are undesirable because of the disruptions or breaks they introduce into the conductive features that are electroplated between the patterned dielectric layers. These inconsistencies introduce nonreproducible electrical characteristics (e.g., electrical resistance and impedance) into the conductive features and may also result in electrical discontinuity in the electrical interconnection scheme.

Prior attempts to prevent this chemical interaction between the surface of the metallic conductor lines and the photosensitive functional group in the dielectric composition include coating a thin layer of titanium or chromium over the surface of the conductor lines prior to coating the surface with the photosensitive dielectric composition. Another method proposes to coat the metallic conductor lines with a layer of a nonphotosensitive polyimide before applying the photosensitive dielectric composition. The nonphotosensitive polyimide, like the thin layer of titanium or chromium, reportedly provides a physical barrier between the photosensitive functional group and the surface of the metallic conductor lines. The physical barrier serves to prevent the chemical interaction; however, these methods require additional process steps and increase the possibility of poor adhesion between the overlapping layers. Further, the use of the titanium, chromium, or nonphotosensitive polyimide layers requires that the protective layer be removed in order to allow a direct electrical connection to be made between the conductor lines of the upper secondary Y-plane and the conductor lines of the lower initial X-plane.

SUMMARY OF THE INVENTION

The present invention provides a means of reducing the likelihood of chemical interaction between a photosensitive functional group in a dielectric composition and a metallic feature over which the dielectric composition is coated. The method is a simple and effective way of increasing the reliability and reproducibility of the photolithographic patterning of dielectric features into the dielectric composition.

A method carried out in accordance with the present invention uses a desensitizer composition comprising an amino-silane to chemically alter the surface of the metallic feature such that the likelihood of chemical interaction between the photosensitive functional group and the metallic feature is reduced. The method involves applying a desensitizer composition comprising an aminosilane to a surface of the metallic feature, preferably the surface to be contacted with the dielectric composition, prior to coating the dielectric composition over the metallic feature. Via interconnections that are subsequently photolithographically patterned into the dielectric composition pass completely through the layer of the dielectric composition and are well defined. Other features that are photolithographically patterned into the dielectric composition are also well defined, though they may not necessarily pass completely through the dielectric composition.

The method carried out in accordance with the present invention can be used in a process for providing a patterned layer of a dielectric composition over a set of metallic conductor lines.

Other objects, features, and advantages of the present invention will be readily apparent from the following description of certain preferred embodiments thereof,

DETAILED DESCRIPTION OF THE INVENTION

Figure 1:
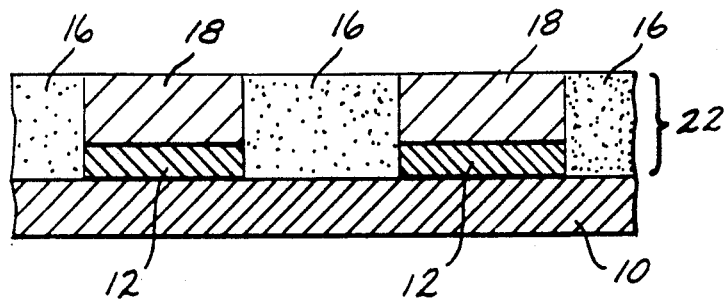
FIGS. 1-4 are schematic, cross-sectional views of a photolithographic patterning process carried out in accordance with the present invention.
Figure 2:
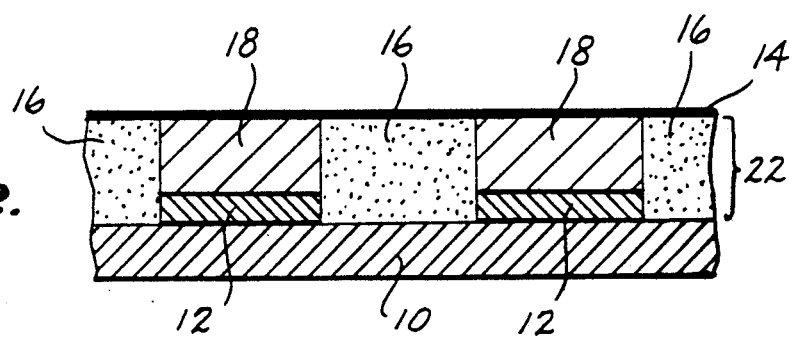
Figure 3:
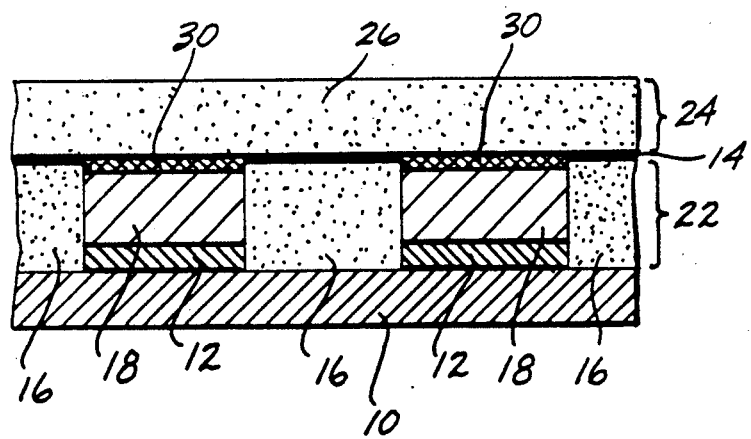

FIGS. 1-4 illustrate a process of reducing the likelihood of chemical interaction between a metallic feature 18 and a photosensitive functional group in a layer of a dielectric composition 26 in FIG. 3 that is coated over the metallic feature, carried out in accordance with the present invention. Referring to FIG. 1, an initial X-plane indicated by reference numeral 22 is formed on a dielectric substrate 10 and includes an electroplating gold or copper seed layer 12 defined between features photolithographically patterned in a layer of a dielectric composition 16. The X-plane 22 also includes metallic features 18 that are electroplated on top of the seed layer 12 between the features patterned in the dielectric composition 16.

Figure 4:
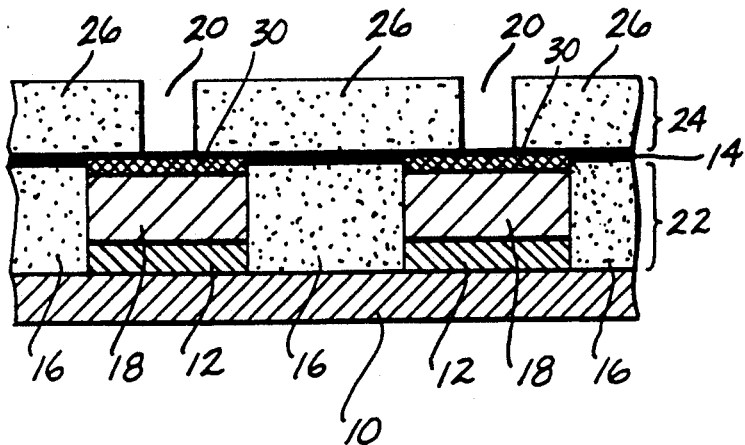

In accordance with the present invention, FIG. 2 shows that a desensitizer composition 14 is applied as a thin layer over the upper surface of the X-plane 22. The desensitizer composition 14 comprises an amino-silane, preferably applied as a dilute mixture of one part amino-silane to ten parts of an aqueous mixture containing 95 volume percent ethanol. In FIG. 3, after the desensitizer composition 14 comprising the amino-silane has been applied to the upper surface of the X-plane 22, the desensitizer composition 14 chemically alters the surface of the metallic features 18 as schematically indicated by an altered zone 30. Next, a Y-plane 24 is begun by depositing a second layer of dielectric composition 26 over the desensitizer composition 14 comprising the amino-silane, and the altered zone 30. In FIG. 4, dielectric composition 26 is photolithographically patterned to provide via interconnects 20 vertically through the dielectric composition 26. The desensitizer composition 14 comprising the amino-silane alters the upper surface of the metallic features 18 in altered zones 30 which effectively reduces the likelihood of chemical interaction between the photosensitive functional group in the dielectric composition 26 and the metallic features 18. By reducing the chemical interaction between the photosensitive functional group in the dielectric composition 26 and the metallic features 18, photolithographic patterning of well defined via interconnects 20 completely through the dielectric composition 26 is reliably achieved. The via interconnects 20 not only pass completely through the dielectric composition 26, but they also are well defined, increasing the reproducibility of the electrical characteristics of the conductive materials that will be deposited into the via interconnects 20.

Referring to FIG. 1 in more detail, the substrate 10 upon which the initial X-plane 22 is supported, is a dielectric substance, typically a silicon wafer. The dielectric substrate 10 supports the seed layer 12, metallic features 18, and the dielectric features that are formed thereon. The formation of the seed layer 12, metallic features 18, and dielectric features that are supported on the dielectric substrate 10 is accomplished by conventional techniques. For example, the electroplating seed layer 12 is formed on the dielectric substrate 10 by sputtering a thin film of gold over titanium or gold over chromium onto the dielectric substrate 10 and then etching portions of the metal off of the dielectric substrate using photoresist techniques. After the electroplating seed layer 12 has been formed, the dielectric composition 16 is spin coated over the electroplating seed layer 12 and then photolithographically patterned to uncover portions of the electroplating seed layer 12. The metallic features 18 are then formed by electroplating a conductive material, such as copper, onto the electroplating seed layer 12 between the features that have been photolithographically patterned into the dielectric composition 16. Although copper has been used as an example of the conductive metal that is electroplated onto the electroplating seed layer 12 to form the metallic features 18, the benefits of the present invention are equally applicable to metallic features made from other metals that chemically interact with the photosensitive functional group of the dielectric composition 26 and alter its photosensitivity.

The dielectric composition 16 that is photolithographically patterned to form the dielectric features in the initial X-plane 22 can be selected from compositions that include a polyimide precursor such as a poly(amic acid) derivative that includes a photosensitive functional group that renders the poly(amic acid) photosensitive. The poly(amic acid) can be synthesized by an amidation reaction of a pyromellitic anhydride in a polar solvent such as N,N-dimethylacetamide, N,N-dimethylformamide, dimethyl sulfoxide, or N-methyl-2-pyrollidone. The poly(amic acid) can then be esterified to introduce the photosensitive functional group into the poly(amic acid), for example, by an acid catalyzed esterification. These dielectric compositions, when applied, are not imidized, but can be imidized in situ by subjecting them to heat after the composition has been coated over substrate 10 and electroplating seed layer 12. The heat treatment serves to convert the poly(amic acid) derivative into a polyimide. Because the poly(amic acid) is not inherently photosensitive, it is chemically modified by adding the photosensitive functional group, such as a photosensitive ester group, in order to render the poly(amic acid) photosensitive. The photosensitive characteristic is needed to photolithographically pattern the dielectric composition. An example of such a photosensitive functional group is described in the publication *A Photopolymer—The Direct Way To Polyimide Patterns*, Rubner et al., Photographic Science and Engineering, Vol. 23, No. 5, September/October 1979, pp. 303-309, the entire text of which is incorporated herein by reference. These types of polyimide precursor compositions are commercially available from EM Industries, Inc., Hawthorne, N.Y. under the designation SELECTILUX ® HTR-3 200 series. Other sources of the polyimide precursor types of dielectric compositions include Hitachi Chemicals (PAL), E.I. duPont de Nemours and Co. (PYRALIN TM PD), Toray Industries (PHOTONEECE TM), and Ciba Geigy Corp. (PROBIMIDE TM).

In providing the dielectric composition 16 in the initial X-plane 22, dielectric compositions including a fully imidized polyimide that is inherently photosensitive can also be used. These types of dielectric compositions are fully imidized in the form that they are coated over substrate 10 and electroplating seed layer 12. The fully imidized polyimide can be synthesized by reacting benzophenone 3,3',4,4'-tetracarboxylic dianhydride (BTDA) with an aromatic diamine that carries orthoaliaphatic substituents and then chemically or thermally imidizing the reaction product. Another method of synthesizing the fully imidized polyimides involves reacting the BTDA with diisocyanates. These types of fully imidized dielectric compositions are commercially available from Ciba Geigy Corporation under the trade name PROBIMIDE TM 400 Series. Although it is possible to use the fully imidized polyimides as the dielectric composition 16 in the X-plane 22, because the polyimide precursor compositions are used as the dielectric composition 26 in the overlapping Y-plane 24, it is preferred that the polyimide precursor compositions also be used in the X-plane 22 in order to avoid the formation of an interface between two chemically different kinds of polyimides. The interface introduces adhesion and chemical compatibility problems between the overlapping layers of different polyimides.

Referring to FIG. 2, after the metallic features 18 and dielectric features of the X-plane 22 have been formed on the substrate 10, the desensitizer composition 14 comprising an amino-silane is applied to the upper surface of the X-plane. The amino-silane can be represented by the formula:

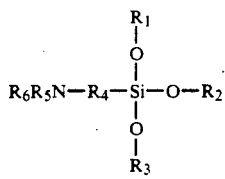

wherein $R_1$, $R_2$, $R_3$, $R_5$, and $R_6$ can be hydrogen or an organic radical such as a lower alkyl radical, and the like, and wherein $R_4$ can be an organic radical such as a lower alkyl radical, and the like.

The above formula is only exemplary of the types of amino-silanes that are useful in desensitizer compositions within the context of the present invention, these types of amino-silanes are generally used in adhesion promoter compositions applied between overlapping microelectronic components such as a dielectric composition and a dielectric substrate. An example of a composition containing an amino-silane useful in the context of the present invention is commercially available from Ciba Geigy Corp. as QZ 3289. Other compositions containing an amino-silane are available from Hitachi Chemical Company and E.I. du Pont De Nemours and Co. Although the desensitizer composition has been described in terms of an amino-silane, other types of desensitizer compositions that chemically modify the conductor surface and reduce chemical interaction between the conductive material and the photosensitive functional groups in the dielectric composition are also within the scope of the present invention.

The densensitizer composition 14 can be applied to the upper surface of the X-plane 22 by a spin coating technique that provides a thin layer having a thickness ranging between about 20 and 100 angstroms, preferably, the thickness of the desensitizer composition 14 ranges between about 20 and 50 angstroms. Such a thickness of the desensitizer composition 14 does not provide a physical barrier between the photosensitive functional group in the dielectric composition 26 and the metallic features 18 but, rather, the desensitizer composition 14 chemically alters the surface of the metallic features 18 in altered zones 30 such that the likelihood of chemical interaction between the photosensitive functional group in the dielectric composition and the metallic feature is reduced.

Referring to FIG. 3, after the desensitizer composition 14 comprising the amino-silane has been coated onto the upper surface of the X-plane 22 and chemically altered the surfaces of the metallic features 18, the Y-plane 24 is begun by depositing a second layer comprising the dielectric composition 26 over the desensitizer composition 14 comprising an amino-silane and the altered zones 30. The dielectric composition 26 in the Y-plane 24 can be applied by spin coating techniques that will provide a uniform layer having a thickness ranging between about 10 and 40 microns. This layer of the dielectric composition 26 in the Y-plane 24 provides a base for an additional layer of conductive lines (not shown) that can be orthogonal to the direction of the metallic features 18 in the X-plane 22. In the context of the present invention, the dielectric composition 26 in the Y-plane 24 is preferably a polyimide precursor type dielectric composition that contains a poly(amic acid) based polyimide precursor that has been chemically modified to include a photosensitive functional group, such as a photosensitive ester group. This is in contrast to the dielectric composition 16 that makes up a portion of the initial X-plane 22, which can be made from either the photosensitive polyimide precursor type dielectric composition or the photosensitive fully-imidized dielectric composition described above. After the dielectric composition 26 has been coated over the desensitizer composition 14 comprising an amino-silane and the altered zones 30, it is prebaked at about 70° C. for about two to three hours before being photolithographically patterned. During the prebaking step, it has been observed that the absence of any significant darkening of the dielectric composition 26 in the Y-plane 24 is indicative of the absence of any chemical interaction between the photosensitive functional group in the dielectric composition 26 and the underlying metallic features 18. As discussed, the photosensitive functional group, in the absence of the desensitizer composition 14 comprising an amino-silane, chemically interacts with the metallic features 18 to effect the photosensitivity of the dielectric composition 26. By coating the surface of the metallic feature with the desensitizer composition, the surface of the metallic features 18 is chemically altered in altered zone 30 so that the chemical interaction between the photosensitive functional group and the metallic features 18 is reduced and the photosensitivity of the dielectric composition 26 is not affected. The reduction in chemical interaction between the photosensitive functional group and the metallic features is evidenced by a reduction in the amount of darkening of the dielectric composition when it is prebaked at about 70° C. for about two to three hours, compared to the amount of darkening observed when the desensitizer composition is not used.

Figure 5:
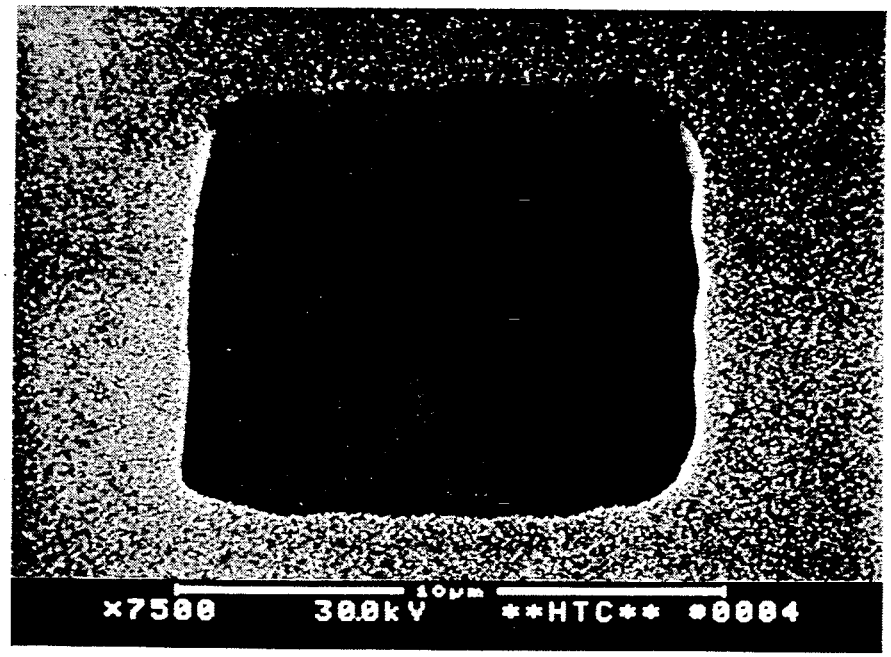
FIG. 5 is a photomicrograph of a via interconnect formed by a process carried out in accordance with the present invention.

Referring to FIG. 4, because a second set of metallic features (not shown) is to be formed on top of the dielectric composition 26 in the Y-plane 24, it is necessary to provide a means for electrically connecting the metallic features in the Y-plane 24 with the metallic features 18 in the X-plane 22. In order to provide these electrical connections, small holes known as via interconnects 20 are photolithographically patterned through the dielectric composition 26 in the Y-plane 24. The via interconnects 20 that are formed by a process carried out in accordance with the present invention go cleanly through the dielectric composition 26 in the Y-plane 24 and are well defined. A continuous hole is essential in order to allow the conductive material that will be electroplated into the via interconnections 20 to contact the underlying metallic features 18 in the X-plane 22. In order for the conductive material to contact the underlying metallic features, it will be necessary to remove the desensitizer composition from the surface of the metallic features, as well as the altered portions of the metallic features. Also, well defined and reliably reproducible via interconnections 20 are desirable because the dimensions of the conductive features that will be electroplated within the via interconnects 20 will be controllable and reproducible which in turn provides a means for controlling and reliably reproducing the electrical characteristics of the electroplated features. In FIG. 5, a 9 micron square via interconnect has been photolithographically patterned in a 12 micron thick layer of a dielectric composition comprising of a polyimide precursor containing a poly(amic acid) derivative with a photosensitive functional group. As is apparent in FIG. 5, the via interconnect having an aspect ratio of 1.3 formed in accordance with the present invention passes completely through the layer of the dielectric composition. Although the present invention is illustrated in FIG. 5 in the context of a via interconnect characterized by an aspect ratio of 1.3, the present invention is also applicable to features that have smaller aspect ratios, for instance around 0.5 or less. Depending on the particular application, the clogging of the via interconnect is often a more severe problem when patterning features having aspect ratios greater than 1.0.

The process carried out in accordance with the present invention reduces the likelihood of chemical interaction between the photosensitive functional group component of a poly(amic acid) based dielectric composition and a metallic feature over which the dielectric composition is coated. The process allows well defined via interconnections to be photolithographically patterned into a layer of the dielectric composition that has been coated over the metallic features. The photolithographically patterned via interconnections pass completely through the dielectric layer and are well defined.

The present invention has been described in relation to the various embodiments, including the preferred applications and parameters. One of ordinary skill in the art, after reading the foregoing specification, will be able to effect various changes, substitutions of equivalents, and other alterations without departing from the broad concept disclosed herein. Although the present invention has been described with reference to the formation of via interconnections, the process is equally applicable to the formation of other features in a layer of a dielectric composition coated over metallic features that chemically interact with the photosensitive functional group in a dielectric composition. It is therefore intended that the scope of Letters Patent granted herein will be limited only by the definition contained in the appended claims and equivalents thereof.

The embodiments of the invention in which an exclusive property or privilege is claimed are defined as follows:

1. A method of providing a patterned layer of a dielectric composition comprising a polyimide precursor that includes a photosensitive functional group, the method comprising:
    (a) applying a desensitizer composition comprising an amino-silane to a surface of a metallic feature, said photosensitive functional group being capable of chemically interacting with said metallic feature to alter the photosensitivity of said dielectric composition, the dielectric composition including a poly(amic acid) reacted to provide a photosensitive functional group therein;
    (b) coating said desensitizer composition comprising said amino-silane and said surface of said metallic feature with said dielectric composition; and
    (c) photolithographically patterning said layer of said dielectric composition.

2. The method of claim 1, wherein said metallic feature comprises copper.

3. The method of claim 1, wherein said amino-silane is represented by the formula:

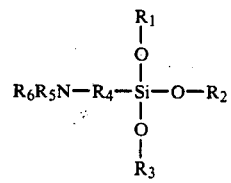

wherein $R_1$, $R_2$, $R_3$, $R_5$, and $R_6$ are hydrogen or a lower alkyl radical, and wherein $R_4$ is a lower alkyl radical.

4. The method of claim 1, wherein said desensitizer composition comprising said amino-silane chemically alters said surface of said metallic feature such that said likelihood of chemical interaction between said photosensitive functional group and said metallic feature is reduced.

5. The method of claim 2, wherein said desensitizer composition comprising said amino-silane when applied to said surface of said metallic feature has a thickness ranging between about 20 and 100 angstroms.

6. The method of claim 1, wherein step (c) further comprises:
    photolithographically patterning fine geometry features into said layer of said dielectric composition, said fine geometry features having a width ranging between about 5 and 20 microns.

7. The method of claim 6, wherein said fine geometry features are via interconnects defined by an opening about 5 to 20 microns wide.

* * * * *